United States Patent
Moxey et al.

(10) Patent No.: US 12,199,045 B2
(45) Date of Patent: Jan. 14, 2025

(54) POWER SEMICONDUCTOR PACKAGE WITH IMPROVED PERFORMANCE

(71) Applicant: Wolfspeed, Inc., Durham, NC (US)

(72) Inventors: Guy Moxey, Boxford, MA (US); Kuldeep Saxena, Sewickley, PA (US)

(73) Assignee: Wolfspeed, Inc., Durham, NC (US)

(*) Notice: Subject to any disclaimer, the term of this patent is extended or adjusted under 35 U.S.C. 154(b) by 187 days.

(21) Appl. No.: 16/832,918

(22) Filed: Mar. 27, 2020

(65) Prior Publication Data

US 2021/0305166 A1 Sep. 30, 2021

(51) Int. Cl.
*H01L 23/538* (2006.01)
*H01L 23/495* (2006.01)
*H01L 23/522* (2006.01)

(52) U.S. Cl.
CPC .... *H01L 23/5389* (2013.01); *H01L 23/49568* (2013.01); *H01L 23/5227* (2013.01)

(58) Field of Classification Search
None
See application file for complete search history.

(56) References Cited

U.S. PATENT DOCUMENTS

| | | | | |
|---|---|---|---|---|
| 4,882,612 A * | 11/1989 | Usui | ...................... | H01L 24/72 257/179 |
| 4,987,474 A * | 1/1991 | Yasuhara | ................ | H01L 24/32 174/536 |
| 6,249,041 B1 * | 6/2001 | Kasem | ..................... | H01L 24/33 257/E23.044 |
| 6,307,755 B1 * | 10/2001 | Williams | ............ | H01L 23/4334 361/813 |
| 6,703,707 B1 * | 3/2004 | Mamitsu | ............. | H01L 23/4006 257/718 |
| 6,882,047 B2 * | 4/2005 | Hata | ....................... | H01L 24/49 257/E23.044 |
| 8,120,153 B1 * | 2/2012 | Shen | ................. | H01L 23/49861 257/677 |
| 9,524,941 B2 * | 12/2016 | Otremba | ........... | H01L 23/49562 |
| 2004/0080028 A1 * | 4/2004 | Yanagisawa | ........ | H01L 23/3107 257/675 |

(Continued)

FOREIGN PATENT DOCUMENTS

| JP | 2016058679 A | 4/2016 |
|---|---|---|
| JP | 2018010995 A | 1/2018 |

(Continued)

*Primary Examiner* — Andres Munoz
(74) *Attorney, Agent, or Firm* — Myers Bigel, P.A.

(57) ABSTRACT

A power semiconductor package includes a power semiconductor die, a housing, a first lead, and a second lead. The housing includes a top side and a bottom side. The first lead is in contact with a first electrical contact of the power semiconductor die. Further, the first lead includes a heat exchanging portion on the top side of the housing and an electrical contact portion on the bottom side of the housing. At least 7.5 mm² of the electrical contact portion of the first lead is available for contacting a printed circuit board. The second lead is in contact with a second electrical contact of the power semiconductor die. The second lead includes a heat exchanging portion on the bottom side of the housing and an electrical contact portion also on the bottom side of the housing.

21 Claims, 6 Drawing Sheets

(56) References Cited

U.S. PATENT DOCUMENTS

| | | | | |
|---|---|---|---|---|
| 2006/0138532 A1* | 6/2006 | Okamoto | ............... | H01L 24/37 |
| | | | | 257/E23.044 |
| 2007/0145540 A1* | 6/2007 | Mochida | ................ | H01L 24/33 |
| | | | | 257/659 |
| 2007/0235860 A1* | 10/2007 | Steger | ................... | H01L 25/072 |
| | | | | 257/706 |
| 2008/0203548 A1* | 8/2008 | Sun | ........................ | H01L 24/48 |
| | | | | 257/E23.044 |
| 2014/0327125 A1* | 11/2014 | Chen | .................. | H01L 23/3135 |
| | | | | 257/678 |
| 2015/0380384 A1* | 12/2015 | Williams | ......... | H01L 23/49555 |
| | | | | 438/112 |
| 2018/0331024 A1* | 11/2018 | Gottwald | ......... | H01L 23/49582 |
| 2018/0342438 A1* | 11/2018 | Chen | ................ | H01L 23/49568 |

FOREIGN PATENT DOCUMENTS

| | | | |
|---|---|---|---|
| JP | 2019121705 A | 7/2019 | |
| WO | 2010110246 A1 | 9/2010 | |
| WO | 2014103000 A1 | 7/2014 | |

* cited by examiner

POWER SEMICONDUCTOR PACKAGE WITH IMPROVED PERFORMANCE

FIELD OF THE DISCLOSURE

The present disclosure is related to packaging technology for power semiconductor devices.

BACKGROUND

For packaged power semiconductor devices, the packaging technology plays a large role in the performance thereof. For example, the packaging for a power semiconductor device may limit the ability of the semiconductor die therein to dissipate heat, conduct current, and even switch at particular speeds (e.g., due to stray inductance). For packaged power semiconductor devices including high performance power semiconductor die such as silicon carbide power semiconductor die, the packaging technology may be a bottleneck in the performance of the devices. Accordingly, there is a need for improved packaging for power semiconductor devices and methods for manufacturing the same.

SUMMARY

In one embodiment, a power semiconductor package includes a power semiconductor die, a housing, a first lead, and a second lead. The power semiconductor die includes a first electrical contact and a second electrical contact. The housing at least partially encapsulates the power semiconductor die and includes a top side and a bottom side. The first lead is in contact with the first electrical contact of the power semiconductor die. Further, the first lead includes a heat exchanging portion exposed on the top side of the housing and an electrical contact portion. At least 7.5 mm² of the electrical contact portion of the first lead is available for contacting a printed circuit board. The second lead is in contact with the second electrical contact of the power semiconductor die. The second lead includes a heat exchanging portion exposed on the bottom side of the housing and an electrical contact portion. By providing the first lead having the heat exchanging portion that is exposed at the top side of the housing, the heat dissipation of the power semiconductor package is improved. Further, by providing the first lead having the electrical contact portion with at least 7.5 mm² available for contacting an external surface such as a printed circuit board, the current handling capability of the power semiconductor package may be improved.

In one embodiment, the power semiconductor die is a transistor such that the first electrical contact is a drain contact and the second electrical contact is a source contact. In particular, the power semiconductor die may be a metal-oxide-semiconductor field-effect transistor. Further, the power semiconductor die may be a silicon carbide device.

In one embodiment, a stray inductance between the first lead and the second lead is in a range including 2.4 nH and 4 nH.

In one embodiment, the power semiconductor package has a footprint less than 210 mm² and is rated to conduct at least 125 A between the first lead and the second lead in a forward conduction mode of operation.

In one embodiment, the second lead further includes a heat exchanging portion exposed on the bottom side of the housing. By providing the first lead and the second lead both having a heat exchanging portion such that they are exposed on opposite sides of the housing, the power semiconductor package may provide improved heat dissipation.

In one embodiment, the first lead is directly coupled to the first electrical contact of the power semiconductor die and the second lead is directly coupled to the second electrical contact of the power semiconductor die. By directly coupling the first lead to the first electrical contact of the power semiconductor die and directly coupling the second lead to the second electrical contact of the power semiconductor die, the current handling capability of the power semiconductor package may be improved due to the lack of current limiting elements such as wirebonds in the current conduction path.

In one embodiment, the power semiconductor package includes a lead frame including the first lead and the second lead. The lead frame is directly coupled to the first electrical contact and the second electrical contact of the power semiconductor die. Again, by directly coupling the lead frame to the first electrical contact and the second electrical contact of the power semiconductor die, the current handling capability of the power semiconductor package may be improved due to the lack of current limiting elements such as wirebonds in the current conduction path.

In one embodiment, the power semiconductor package is one of a Decawatt package and a Double Decawatt Package.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4B-2 is a diagram illustrating a bottom-up view of a power semiconductor package wherein the housing is made transparent to illustrate one or more internal connections made to the power semiconductor die according to an additional embodiment of the present disclosure.

FIG. 4C-1 is a diagram illustrating a top-down view of a power semiconductor package wherein the housing is made transparent to illustrate one or more internal connections made to the power semiconductor die according to one embodiment of the present disclosure.

FIG. 4C-2 is a diagram illustrating a top-down view of a power semiconductor package wherein the housing is made transparent to illustrate one or more internal connections made to the power semiconductor die according to an additional embodiment of the present disclosure.

DETAILED DESCRIPTION

Figure 1C:
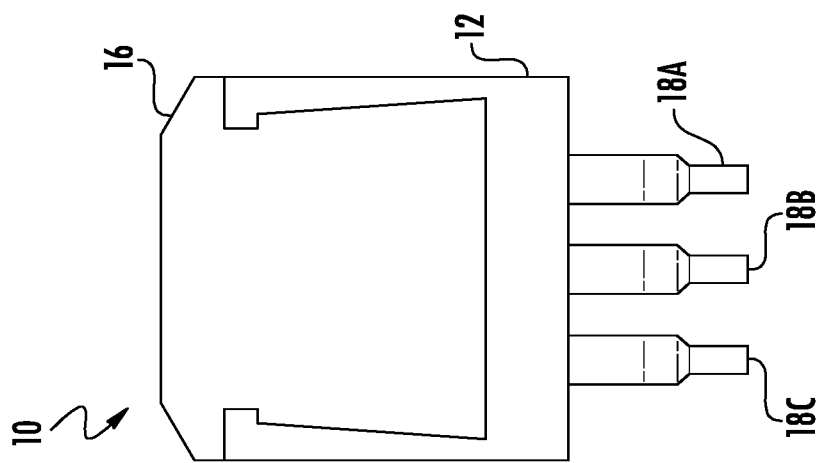
FIGS. 1A through 1C are diagrams illustrating the exterior of an exemplary power semiconductor package.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As discussed above, the packaging technology of power semiconductor devices plays a large role in defining the performance thereof. In particular, the packaging for power semiconductor devices is often a limiting factor in the performance thereof.

Figure 1B:
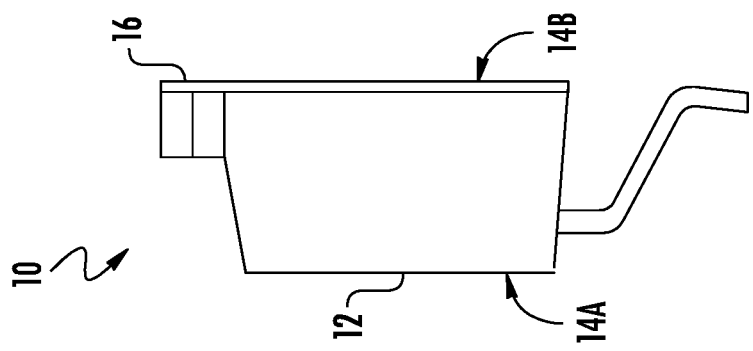
Figure 1A:
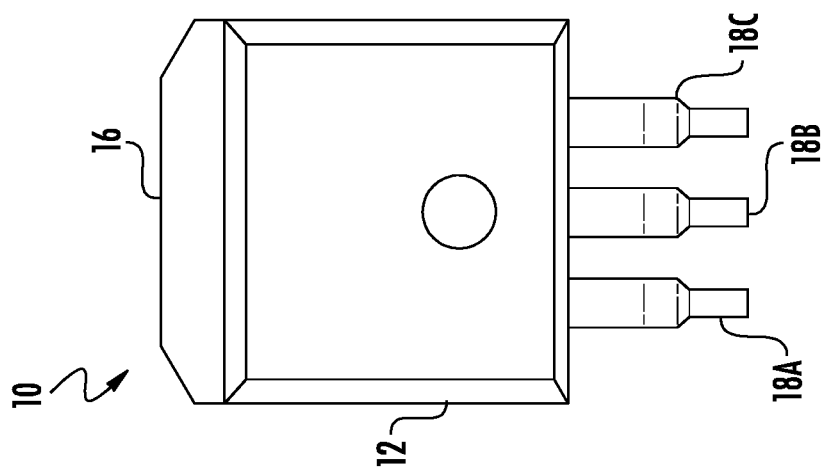

One exemplary standard package for power semiconductor devices is a Decawatt Package (DPak) and a Double Decawatt Package (D2Pak). FIGS. 1A through 1C are diagrams illustrating the exterior of an exemplary power semiconductor package 10, which in the present embodiment is a D2Pak. The power semiconductor package 10 includes a housing 12 having a top side 14A and a bottom side 14B. As discussed below, the bottom side 14B is generally mounted onto a printed circuit board (PCB), while the top side 14A is generally left exposed when the power semiconductor package 10 is mounted to a PCB. The power semiconductor package 10 further includes a heat spreader 16 exposed on the bottom side 14B of the housing 12 and a number of leads 18 (labeled individually as 18A through 18C) for electrical connection to one or more power semiconductor die (not shown) in the housing 12. For example, the housing 12 may include a transistor power semiconductor die and thus a first one of the leads 18A may be coupled to a gate contact of the transistor, a second one of the leads 18B may be coupled to a source contact of the transistor, and a third one of the leads 18C may be coupled to a drain contact of the transistor. The transistor or any other power semiconductor die in the housing 12 may be thermally coupled to the heat spreader 16. When mounted on a PCB, the heat spreader 16 may be provided in contact with a heat dissipating structure of the PCB such as a metal pad in order to spread the heat generated by the power semiconductor die in the housing 12.

Figure 2A:
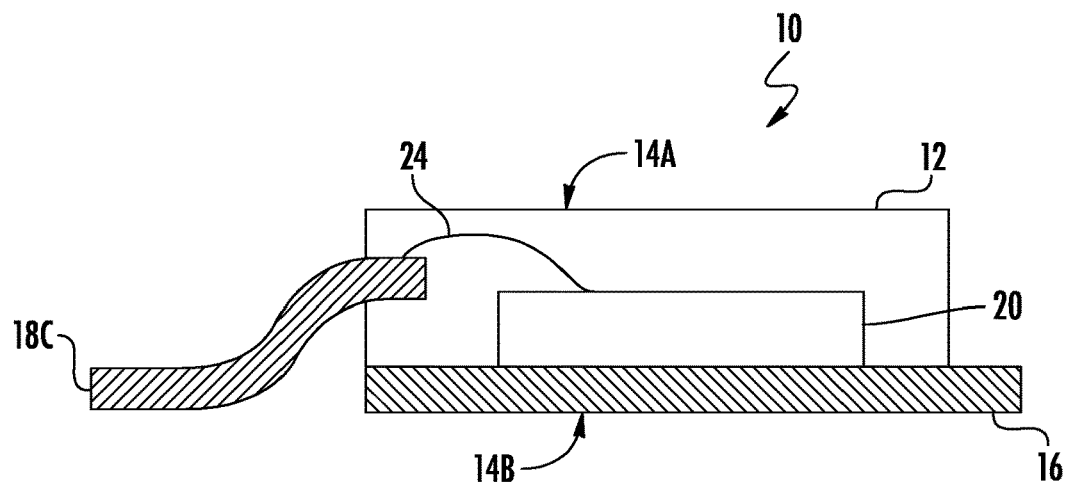
FIG. 2A is a diagram illustrating a cross-sectional view of a power semiconductor package illustrating one or more internal connections made to a power semiconductor die in the housing.
Figure 2B:
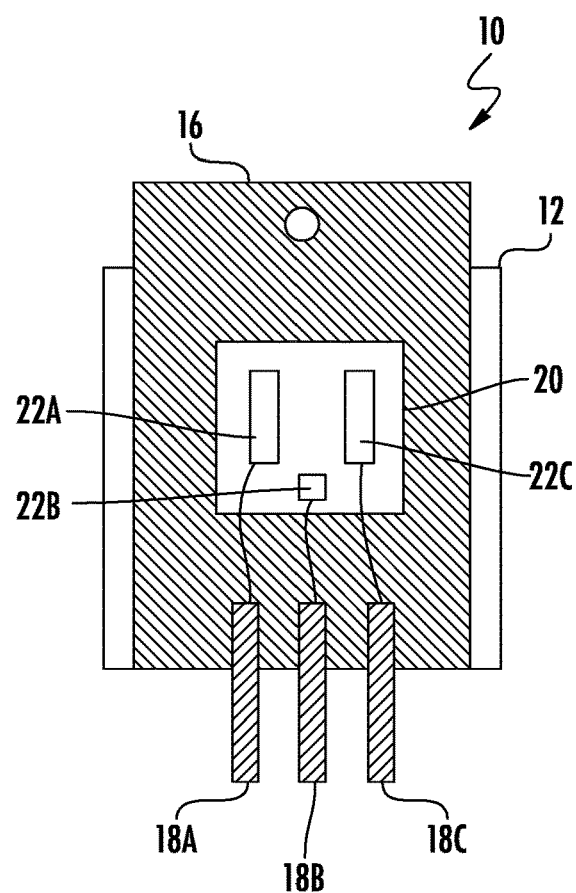
FIG. 2B is a diagram illustrating a top-down view of a power semiconductor package wherein the housing is made transparent to illustrate the one or more internal connections made to the power semiconductor die.

FIG. 2A is a diagram illustrating a cross-sectional view of the power semiconductor package 10 illustrating one or more internal connections made to a power semiconductor die 20 in the housing 12. FIG. 2B is a diagram illustrating a top-down view of the power semiconductor package 10 wherein the housing 12 is made transparent to illustrate the one or more internal connections made to the power semiconductor die 20. As shown in FIGS. 2A and 2B, the power semiconductor die 20 is provided on the heat spreader 16 such that the power semiconductor die 20 is thermally coupled to the heat spreader 16. The leads 18 extend into the housing 12 and are held in place by the housing 12. Each one of the leads 18 is coupled to a corresponding contact pad 22 (labeled individually as 22A through 22C) via a wirebond 24.

Figure 3:
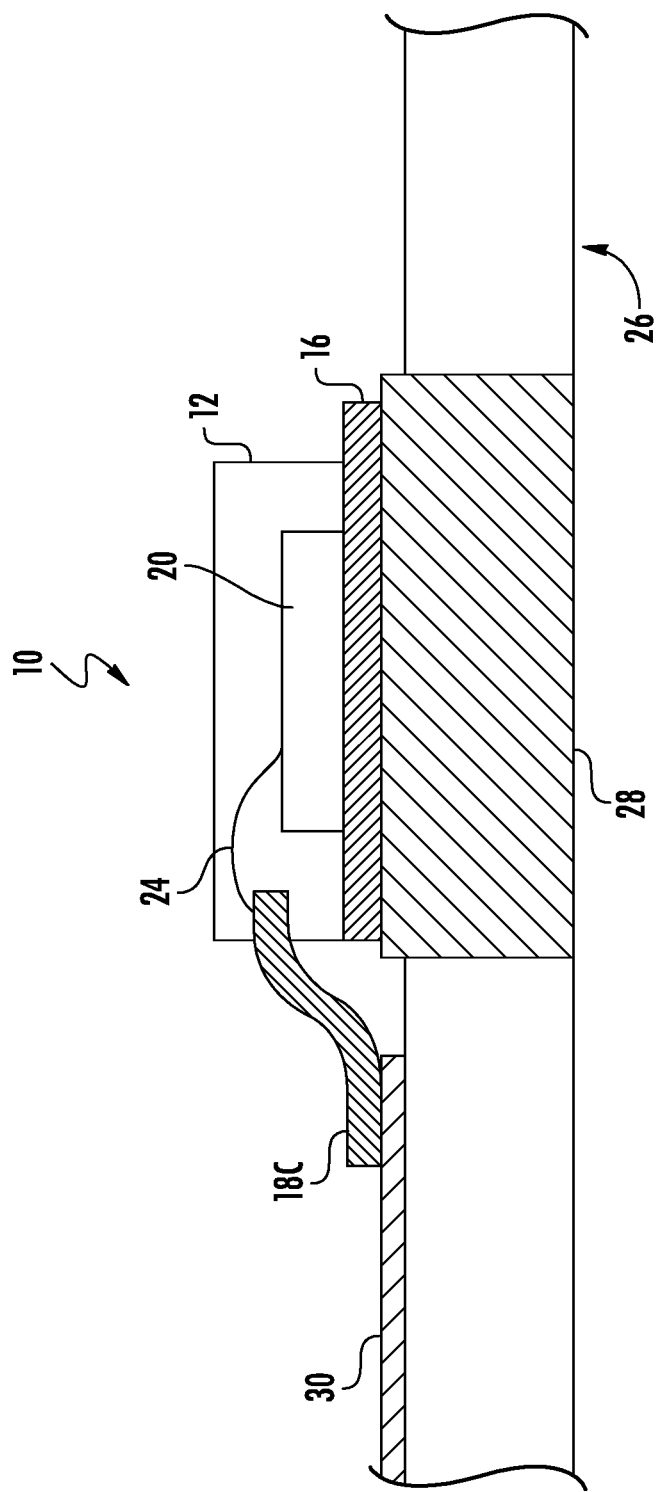
FIG. 3 is a diagram illustrating a cross-sectional view of a power semiconductor package mounted on a printed circuit board (PCB).

FIG. 3 is a diagram illustrating a cross-sectional view of the power semiconductor package 10 mounted on a PCB 26. As shown, the heat spreader 16 is provided on a heat dissipating structure 28 of the PCB 26 such that heat generated by the power semiconductor die 20 can be dissipated through the heat spreader 16 and the heat dissipating structure 28 of the PCB 26. Each one of the leads 18 is coupled to a corresponding electrical trace 30 on the PCB 26. Since FIG. 3 is a cross-sectional view of the power semiconductor package 10, only one of the leads 18 is shown coupled to a single electrical trace 30 on the PCB 26. However, those skilled in the art will readily appreciate that each one of the leads 18 will be coupled to a different electrical trace on the PCB 26.

As discussed above, the power semiconductor die 20 may be a transistor device. In one embodiment, the power semiconductor die 20 is a metal-oxide-semiconductor field-effect transistor (MOSFET), however, the present disclosure contemplates any type of semiconductor die, such as a Schottky diode, or other silicon carbide (SiC) semiconductor devices. In such an embodiment, a first contact pad 22A may be a source contact pad coupled to a source of the MOSFET, a second contact pad 22B may be a gate contact pad coupled to a gate of the MOSFET, and a third contact pad 22C may be a drain contact pad coupled to a drain of the MOSFET.

In some situations, the performance of the power semiconductor package 10 may be limited by the packaging technology thereof. For example, due to the use of the wirebonds 24 for the connections between the leads 18 of the power semiconductor package 10 and the contact pads 22 of the power semiconductor die 20, and due to the relatively small area of each one of the leads 18 available for contact with the PCB 26, an impedance between the PCB 26 and the contact pads 22 of the power semiconductor die 20 may be relatively high. This may cause the current handling capability of the power semiconductor die 20 to be greater than the current handling capability of the power semiconductor package 10. This may further increase a stray inductance of the power semiconductor package 10, and in particular a stray inductance between one of the leads 18 coupled to the source of the power semiconductor die 20 and one of the leads 18 coupled to the drain of the power semiconductor die 20. Further, due to the fact that heat is dissipated from the power semiconductor die 20 through only the bottom side 14B of the housing 12, the heat dissipation of the power semiconductor package 10 may be limited. This may further decrease the performance thereof.

Figure 4A:
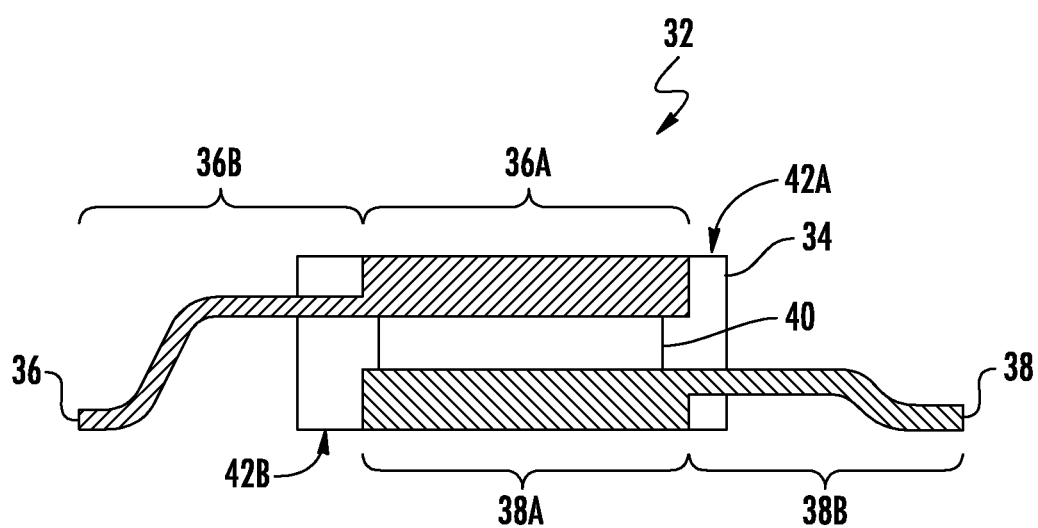
FIG. 4A is a diagram illustrating a cross-sectional view of a power semiconductor package according to one embodiment of the present disclosure.

In an effort to improve thermal and electrical performance, FIG. 4A is a diagram illustrating a cross-sectional view of a power semiconductor package 32 according to one embodiment of the present disclosure. The power semiconductor package 32 includes a housing 34, a first lead 36, a second lead 38, and a power semiconductor die 40. The housing 34 includes a top side 42A and a bottom side 42B. The first lead 36 includes a heat exchanging portion 36A and an electrical contact portion 36B. The second lead 38 includes a heat exchanging portion 38A and an electrical contact portion 38B. The heat exchanging portion 36A of the first lead 36 is exposed or accessible on the top side 42A of the housing 34. The heat exchanging portion 38A of the second lead 38 is exposed or accessible on the bottom side 42B of the housing 34. In certain embodiments, a surface of the heat exchanging portion 36A of the first lead 36 is coplanar with the top side 42A of the housing 34 and the heat exchanging portion 38A of the second lead 38 is coplanar with the bottom side 42B of the housing 34 Accordingly, the power semiconductor die 40 is effectively sandwiched between the heat exchanging portion 36A of the first lead 36 and the heat exchanging portion 38A of the second lead and both the heat exchanging portion 36A of the first lead 36 and the heat exchanging portion 38A of the second lead 38 are exposed or accessible for contact with a heat dissipating portion of a PCB. Both the electrical contact portion 36B of the first lead 36 and the electrical contact portion 38B of the second lead 38 are exposed or accessible on the bottom side 42B of the housing 34 such that they are configured to make electrical contact with one or more electrical traces on a PCB as discussed below.

Figures 1, 4B:
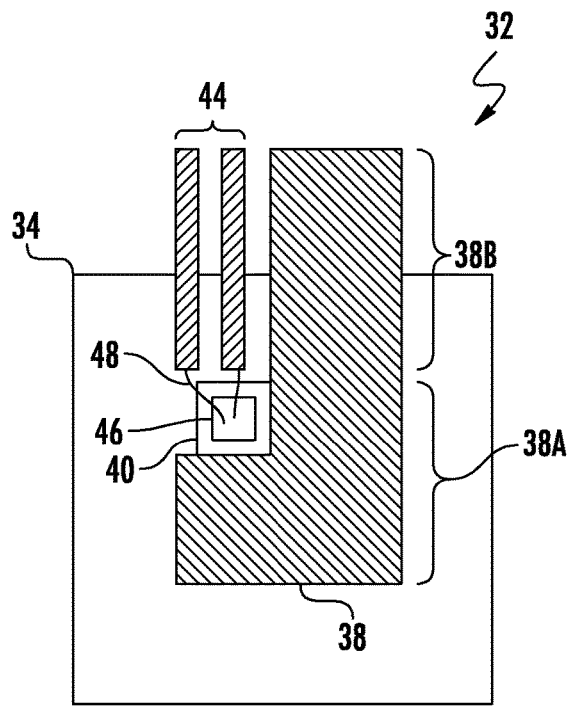
FIG. 4B-1 is a diagram illustrating a bottom-up view of a power semiconductor package wherein the housing is made transparent to illustrate the one or more internal connections made to the power semiconductor die according to one embodiment of the present disclosure.

FIG. 4B-1 is a diagram illustrating a bottom-up view of the power semiconductor package 32 wherein the housing 34 is made transparent to illustrate the one or more internal connections made to the power semiconductor die 40 according to one embodiment of the present disclosure. FIG. 4B-1 shows the second lead 38 and a third lead 44, which was obscured by the second lead 38 in FIG. 4A. As shown in FIG. 4B-1, the heat exchanging portion 38A of the second lead 38 is in contact with a large portion of the power semiconductor die 40. While not shown, the heat exchanging portion 38A of the second lead 38 is also in electrical contact with an electrical pad of the power semiconductor die 40. The electrical contact portion 38B of the second lead 38 extends away from the heat exchanging portion 38A and outside the housing 34 to provide a place for contact with a PCB. Accordingly, the electrical contact portion 38B is directly coupled to a contact pad of the power semiconductor die 40, rather than connected to the power semiconductor die 40 via one or more wirebonds as discussed above. The second lead 38 may thus be described as being coupled to the power semiconductor die 40 via a lead connection "tab" (a relatively wide piece of metal). Further, the second lead 38 may be described as forming part of a lead frame of the power semiconductor package 32, which is directly coupled to a contact pad of the power semiconductor die 40. As illustrated, the third lead 44 includes a number of lead fingers each coupled to a contact pad 46 on the power semiconductor die 40 via a wirebond 48. In this manner, the third lead 44 may comprises a number of discontinuous lead fingers that are coupled to the same contact pad 46 by wirebonds 48. In other embodiments, the third lead 44 may be configured without digitated lead fingers.

In various embodiments, the electrical contact portion 38B of the second lead 38 may be configured to provide a large contact area for contacting an external surface such as a PCB. For example, the electrical contact portion 38B of the second lead 38 may provide a contact area greater than 7.5 mm$^2$, or greater than 10 mm$^2$ for contacting an external surface, and in various embodiments may provide a contact area in a range including 7.5 mm$^2$ and 20 mm$^2$, or in a range including 10 mm$^2$ and 20 mm$^2$ for contacting an external surface. To accomplish this, a width of the electrical contact portion 38B of the second lead 38 may be greater than 1 mm, or greater than 2 mm, and in various embodiments may be in a range including 1 mm and 7 mm, or in a range including 1 mm and 5 mm. Providing the electrical contact portion 38B of the second lead 38 having a large area for contacting an external surface increases the current carrying capability of the second lead 38. This may in turn remove bottlenecks in the current handling capability of the power semiconductor package 32 caused by the packaging technology and improve the performance thereof.

Further, providing the electrical contact portion 38B of the second lead 38 having a large area for contacting an external surface may reduce stray inductance between the external surface, such as a PCB, and the power semiconductor die 40. Additionally, for embodiments where coupling between the electrical contact portion 38B and the power semiconductor die 40 is provided without wirebonds, the stray inductance may also be reduced. For example, a stray inductance between the first lead 36 and the second lead 38 for typical arrangements may be about 4.8 nanohenries (nH). By one or more of increasing the contact area between the second lead 38 and a PCB and eliminating wirebonds between the power semiconductor die 40 and the second lead 38, the stray inductance may accordingly be less than 4.8 nH, or less than or equal to 3 nH, or in a range including 2.4 nH and 4.7 nH, or in a range including 2.4 nH and 4 nH, As will be appreciated by those skilled in the art, having a low stray inductance may improve the performance of the power semiconductor package 32, for example, by improving a switching speed thereof.

Figures 2, 4B:
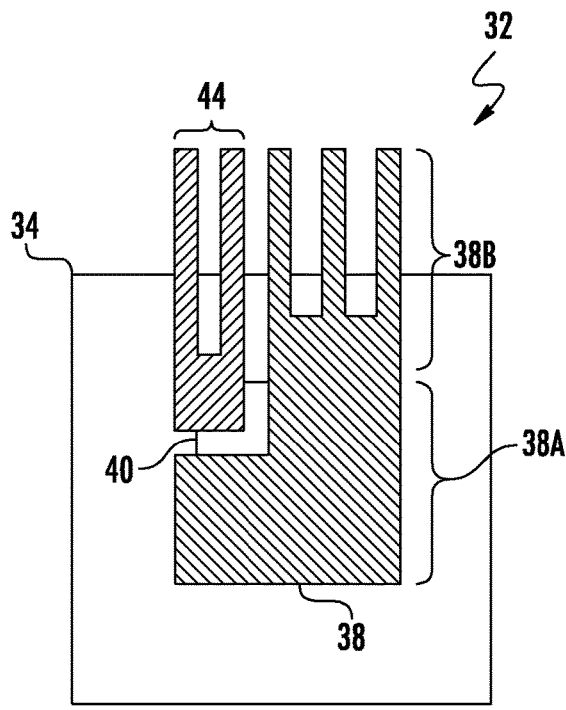

FIG. 4B-2 is a diagram illustrating a bottom-up view of the power semiconductor package 32 wherein the housing 34 is made transparent to illustrate one or more internal connections made to the power semiconductor die 40 according to an additional embodiment of the present disclosure. The power semiconductor package 32 shown in FIG. 4B-2 is substantially similar to that shown in FIG. 4B-1, except that the third lead 44 is coupled to the contact pad 46 of the power semiconductor die 40 directly instead of with one or more wirebonds. As illustrated, the third lead 44 includes a number of digitated fingers that are continuous with one another to form the third lead 44. In other embodiments, the third lead 44 as illustrated in FIG. 4B-2 may be coupled to the contact pad 46 by way of the wirebonds 48 as illustrated in FIG. 4B-1. Further, the electrical contact portion 38B of the second lead 38 is digitated such that the electrical contact portion 38B of the second lead 38 is divided into a number of lead fingers, each separated from one another and joined together within the housing 34. In some embodiments, each one of the lead fingers of the electrical contact portion 38B of the second lead 38 may be joined by the heat exchanging portion 38A thereof. While digitating the electrical contact portion 38B of the second lead 38 may slightly reduce an area available for contacting a PCB, this can be compensated for by increasing a width of the electrical contact portion 38B of the second lead 38. Further, digitating the electrical contact portion 38B of the second lead 38 may reduce stress on the second lead 38 when it is fixed to a PCB, for example, by a soldering process. This is due to the reduction in stress afforded by the space between the lead fingers, which reduce thermal expansion and contraction and thus stress on the second lead 38. This may in turn increase the reliability of the power semiconductor package 32 when it is fixed to a PCB. Additionally, improved stress relief as described above may provide lower inductance or reduced stray inductance and higher current carrying capability for the power semiconductor package 32.

Figures 1, 4C:
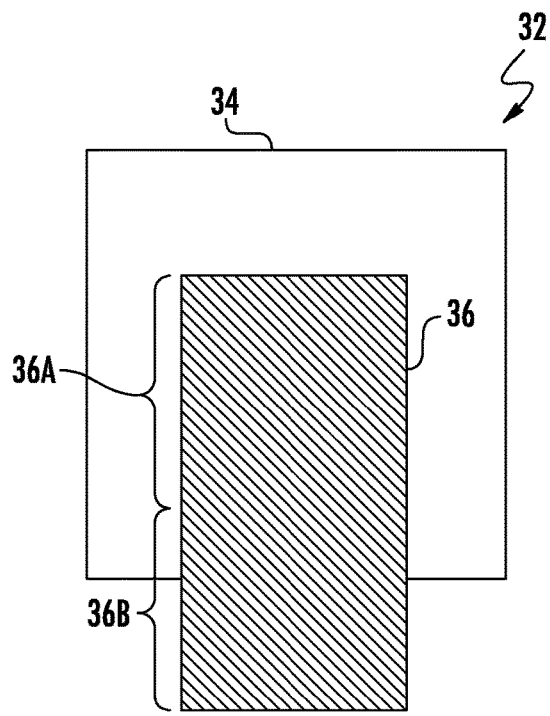
Figures 2, 4C:
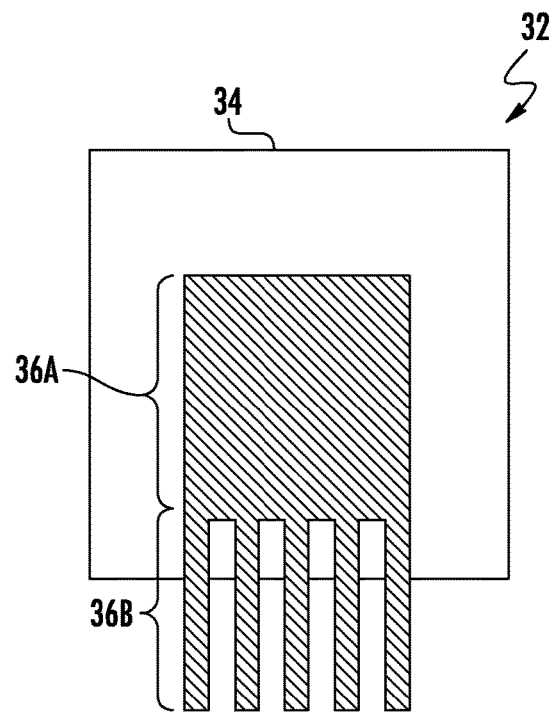

FIG. 4C-1 is a diagram illustrating a top-down view of the power semiconductor package 32 wherein the housing 34 is made transparent to illustrate one or more internal connections made to the power semiconductor die 40 according to one embodiment of the present disclosure. As shown, the first lead 36 includes the heat exchanging portion 36A and the electrical contact portion 36B extending from the heat exchanging portion 36A outside the housing 34 to provide a place for contact with a PCB. In the present embodiment, the electrical contact portion 36B extends having the same width or near the same width as the heat exchanging portion 36A. However, as shown in FIG. 4A above, a thickness of the heat exchanging portion 36A may be thicker than the electrical contact portion 36B in some embodiments. Similar to the second lead 38 discussed above, the electrical contact portion 36B of the first lead 36 may be configured to provide a large contact area for contacting a PCB. For example, the electrical contact portion 36B of the first lead 36 may provide a contact area greater than 25 mm$^2$ for contacting a PCB, and in various embodiments may provide a contact area in a range including 25 mm$^2$ and 100 mm$^2$. Providing the electrical contact portion 36B of the first lead 36 having a large area for contacting a PCB increases the current carrying capability of the first lead 36. This may in turn remove bottlenecks in the current handling capability of the power semiconductor package 32 caused by the packaging technology and improve the performance thereof. Further, providing the electrical contact portion 36B of the first lead 36 having a large area for contacting a PCB may reduce stray inductance between the PCB and the power semiconductor die 40 and provide higher current carrying capability. In certain embodiments, a stray inductance between the first lead 36 and the second lead 38 is less than 4.8 nH, or less than or equal to 3 nH, or in a range including 2.4 nH and 4.7 nH, or in a range including 2.4 nH and 4 nH. As will be appreciated by those skilled in the art, having a low stray inductance may improve the performance of the power semiconductor package 32, for example, by improving a switching speed thereof.

FIG. 4C-2 is a diagram illustrating a top-down view of the power semiconductor package 32 wherein the housing 34 is made transparent to illustrate one or more internal connections made to the power semiconductor die 40 according to an additional embodiment of the present disclosure. FIG. 4C-2 is substantially similar to FIG. 4C-1, except that the electrical contact portion 36B of the first lead 36 is digitated such that the electrical contact portion 36B of the first lead 36 is divided into a number of lead fingers, each of which are separated from one another and joined together within the housing 34. In some embodiments, each one of the lead fingers of the electrical contact portion 36B of the first lead 36 may be joined by the heat exchanging portion 36A thereof. While digitating the electrical contact portion 36B of the first lead 36 may slightly reduce an area available for contacting a PCB, this can be compensated for by increasing a width of the electrical contact portion 36B of the first lead 36. Further, digitating the electrical contact portion 36B of the first lead 36 may reduce stress on the first lead 36 when it is fixed to a PCB, for example, by a soldering process. This is due to the reduction in stress afforded by the space between the lead fingers, which reduce thermal expansion and contraction and thus stress on the first lead 36. This may in turn increase the reliability of the power semiconductor package 32 when it is fixed to a PCB. Additionally, improved stress relief as described above may provide lower inductance or reduced stray inductance and higher current carrying capability for the power semiconductor package 32. In various embodiments, the power semiconductor package 32, the first lead 36, the second lead 38, and the third lead 44 may be configured with any combination of the bottom-up views illustrated in FIGS. 4B-1 and 4B-2 and the top-down views illustrated in FIGS. 4C-1 and 4C-2. Stated differently, the power semiconductor package 32 may be configured according to FIGS. 4B-1 and 4C-1, or FIGS. 4B-1 and 4C-2, or FIGS. 4B-2 and 4C-1, or FIGS. 4B-2 and 4C-2 in various embodiments.

Figure 5:
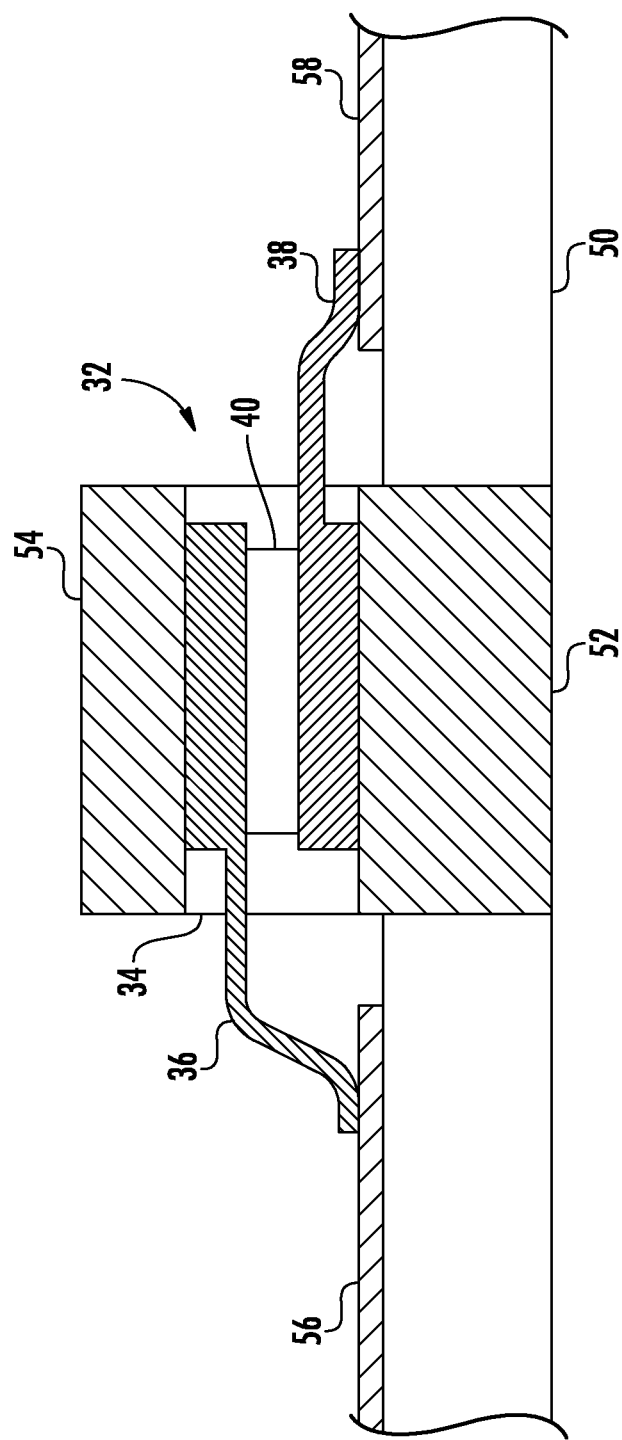
FIG. 5 is a diagram illustrating a cross-sectional view of a power semiconductor package mounted on a PCB according to one embodiment of the present disclosure.

FIG. 5 is a diagram illustrating a cross-sectional view of the power semiconductor package 32 mounted on a PCB 50. As shown, the power semiconductor package 32 is provided bottom side 42B down on the PCB 50 such that the heat exchanging portion 38A of the second lead 38 is thermally coupled to a heat dissipating structure 52 of the PCB 50 such that heat generated by the power semiconductor die 40 can be dissipated through the heat exchanging portion 38A of the second lead 38 and the heat dissipating structure 52 of the PCB 50. Further, a heatsink 54 is provided on the top side 42A of the power semiconductor package 32 such that the heat exchanging portion 36A of the first lead 36 is thermally coupled to the heatsink 54. While not shown, the heatsink 54 may be thermally coupled to the heat dissipating structure 52 of the PCB 50 in another plane. Because the power semiconductor package 32 allows for thermally coupling to the power semiconductor die 40 from both sides of the package, the heat dissipating capabilities of the power semiconductor package 32 are significantly improved. This may in turn increase the electrical performance of the power semiconductor package in some situations.

As is further shown, the electrical contact portion 36B of the first lead 36 is coupled to a first electrical trace 56 on the PCB 50. Further, the electrical contact portion 38B of the second lead 38 is coupled to a second electrical trace 58 on the PCB 50. As discussed above, a large area of the electrical contact portion 36B of the first lead 36 may be in contact with the first electrical trace 56. Further, a large area of the electrical contact portion 38B of the second lead 38 may be in contact with the second electrical trace 58. This may improve the current handling capabilities and stray inductance of the power semiconductor package 32 as discussed above. While not shown, the third lead 44 may be coupled to a third electrical trace 60 of the PCB 50.

The power semiconductor die 40 may be a transistor in some embodiments. However, the present disclosure is not so limited and contemplates any type of semiconductor device being provided by the power semiconductor die 40. In particular, the power semiconductor die 40 may be a MOSFET having a gate, a drain, and a source. The first lead 36 may be coupled directly to a contact pad of the power semiconductor die 40 that is electrically coupled to a drain thereof. The second lead 38 may be coupled directly to a contact pad of the power semiconductor die 40 that is electrically coupled to a source thereof. The third lead 44 may be coupled directly to a contact pad of the power semiconductor die 40 that is electrically coupled to a gate thereof. Those skilled in the art will readily appreciate that the source and drain of a MOSFET, and in particular a power MOSFET, may handle large voltages and currents.

Because the first lead 36 and the second lead 38 are configured as discussed above to improve current handling capability, the power semiconductor package 32 may be rated to conduct at least 150 A in a forward conduction mode of operation, and in various embodiments may be rated to conduct in a range including 125 A and 175 A.

The dimensions of the power semiconductor package 32 may conform to the DPak or D2Pak standard in various embodiments. As such, a footprint of the power semiconductor package 32 may be defined by a length and width of the housing 34 of 9.075 mm by 10.180 mm with a length of the first lead 36 as measured from the housing 34 to an end of the first lead 36 of 5.685 mm, and a length of the second lead 38 as measured from the housing 34 to an end of the second lead 38 that is also 5.685 mm. This provides an overall length of 20.445 mm and an overall width of 10.180 mm for the power semiconductor package 32 and a corresponding footprint of 208.13 mm$^2$. In various embodiments, the power semiconductor package 32, including the housing 34 and the first and second leads 36, 38, may scale larger or smaller depending on the desired performance. For example, the power semiconductor package 32 may have a footprint of less than 210 mm$^2$, or in a range including 150 mm$^2$ and 300 mm$^2$, or in a range including 150 mm$^2$ and 210 mm$^2$, or in a range including 210 mm$^2$ and 300 mm$^2$. However, the present disclosure is not so limited. The principles of the present disclosure may be applied to any packaging standards having any dimensions, all of which are contemplated herein.

Those skilled in the art will recognize improvements and modifications to the preferred embodiments of the present disclosure. All such improvements and modifications are considered within the scope of the concepts disclosed herein and the claims that follow.

What is claimed is:

1. A power semiconductor package comprising:
    a transistor comprising a drain contact, a source contact, and a gate contact;
    a housing for the transistor, the housing comprising a top side and a bottom side, wherein the bottom side forms a mounting side of the housing;
    a first lead in contact with the drain contact, the first lead including a heat exchanging portion on the top side of the housing and an electrical contact portion;
    a second lead in contact with the source contact, the second lead including a heat exchanging portion on the bottom side of the housing and an electrical contact portion on the bottom side of the housing; and
    a third lead in contact with the gate contact, the third lead comprising a plurality of contact fingers that are joined together and separated from one another within the housing,
    wherein all of the plurality of contact fingers extend from a single side of the housing.

2. The power semiconductor package of claim 1 wherein the transistor is a metal-oxide-semiconductor field-effect transistor (MOSFET).

3. The power semiconductor package of claim 2 wherein the transistor is a silicon carbide device.

4. The power semiconductor package of claim 1 wherein a stray inductance between the first lead and the second lead is in a range from 2.4 nH to 4 nH.

5. The power semiconductor package of claim 1 wherein:
    the power semiconductor package has a footprint less than 210 mm$^2$; and
    the power semiconductor package is rated to conduct at least 125 A between the first lead and the second lead in a forward conduction mode of operation.

6. The power semiconductor package of claim 1 wherein:
    the first lead is directly coupled to the drain contact of the transistor; and
    the second lead is directly coupled to the source contact of the transistor.

7. The power semiconductor package of claim 1 wherein:
    the power semiconductor package further comprises a lead frame including the first lead and the second lead; and
    the lead frame is directly coupled to the drain contact and the source contact of the transistor.

8. The power semiconductor package of claim 1 wherein the power semiconductor package is one of a Decawatt Package and a Double Decawatt Package.

9. The power semiconductor package of claim 1 wherein the first lead comprises a plurality of contact fingers extending from the heat exchanging portion of the first lead.

10. The power semiconductor package of claim 1 wherein the second lead comprises a plurality of contact fingers extending from the heat exchanging portion of the second lead.

11. The power semiconductor package of claim 1 wherein the plurality of contact fingers of the third lead are separated from one another outside the housing.

12. A power semiconductor package comprising:
a power semiconductor die comprising a first electrical contact, a second electrical contact, and a third electrical contact;
a housing for the power semiconductor die, the housing comprising a top side and a bottom side;
a first lead in contact with the first electrical contact of the power semiconductor die, the first lead including a first heat exchanging portion on the top side of the housing and a first electrical contact portion defining a first contact area for contacting a first external element, wherein the first electrical contact portion comprises a first plurality of contact fingers extending from the first heat exchanging portion, and wherein the first contact area is in a range from 25 mm$^2$ to 100 mm$^2$;
a second lead in contact with the second electrical contact of the power semiconductor die, the second lead including a second heat exchanging portion on the bottom side of the housing and a second electrical contact portion defining a second contact area for contacting a second external element, wherein the second contact area is in a range from 7.5 mm$^2$ to 20 mm$^2$; and
a third lead including a second plurality of digitated contact fingers that are in contact with the same third electrical contact, the second plurality of digitated contact fingers being joined together within the housing,
wherein the first heat exchanging portion is configured to thermally couple to a heat sink arranged on the top side of the housing and external to the housing, and
wherein the second heat exchanging portion of the second lead is configured to thermally couple to a heat dissipating structure on the bottom side of the housing and external to the housing.

13. The power semiconductor package of claim 12 wherein the power semiconductor die is a transistor such that the first electrical contact is a drain contact and the second electrical contact is a source contact.

14. The power semiconductor package of claim 13 wherein the power semiconductor die is a metal-oxide-semiconductor field-effect transistor (MOSFET).

15. The power semiconductor package of claim 14 wherein the power semiconductor die is a silicon carbide device.

16. The power semiconductor package of claim 12 wherein a stray inductance between the first lead and the second lead is in a range from 2.4 nH to 4 nH.

17. The power semiconductor package of claim 12 wherein:

the power semiconductor package has a footprint in a range from 150 mm$^2$ to 300 mm$^2$; and
the power semiconductor package is rated to conduct at least 125 A between the first lead and the second lead in a forward conduction mode of operation.

18. The power semiconductor package of claim 12 wherein:
the first lead is directly coupled to the first electrical contact of the power semiconductor die; and
the second lead is directly coupled to the second electrical contact of the power semiconductor die.

19. The power semiconductor package of claim 12 wherein:
the power semiconductor package further comprises a lead frame including the first lead and the second lead; and
the lead frame is directly coupled to the first electrical contact and the second electrical contact of the power semiconductor die.

20. The power semiconductor package of claim 12 wherein the power semiconductor package is one of a Decawatt Package and a Double Decawatt Package.

21. A power semiconductor package comprising:
a power semiconductor die comprising a first electrical contact and a second electrical contact;
a housing for the power semiconductor die, the housing comprising a top side and a bottom side;
a first lead in contact with the first electrical contact of the power semiconductor die, the first lead including a heat exchanging portion that is coplanar with the top side of the housing and a first electrical contact portion defining a first contact area for contacting a first external element, wherein the first contact area is in a range from 25 mm$^2$ to 100 mm$^2$;
a second lead in contact with the second electrical contact of the power semiconductor die, the second lead including a heat exchanging portion that is coplanar with on the bottom side of the housing and a second electrical contact portion defining a second contact area for contacting a second external element, wherein the second contact area is in a range from 7.5 mm$^2$ to 20 mm$^2$, and wherein a width of the second contact area is in a range of 1 mm to 7 mm;
a heat sink arranged on and extending away from the top side of the housing and thermally coupled to the heat exchanging portion of the first lead; and
a heat dissipating structure thermally coupled to the heat exchanging portion of the second lead on and extending away from the bottom side of the housing.

\* \* \* \* \*